US010814534B2

(12) United States Patent
Shudo et al.

(10) Patent No.: US 10,814,534 B2
(45) Date of Patent: Oct. 27, 2020

(54) DISCHARGE APPARATUS, IMPRINT APPARATUS, METHOD OF DETECTION, METHOD OF DETERMINATION, AND METHOD FOR MANUFACTURING ARTICLE

(71) Applicant: CANON KABUSHIKI KAISHA, Tokyo (JP)

(72) Inventors: Shinichi Shudo, Saitama (JP); Yuichi Fujita, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 381 days.

(21) Appl. No.: 15/629,176

(22) Filed: Jun. 21, 2017

(65) Prior Publication Data

US 2017/0368726 A1 Dec. 28, 2017

(30) Foreign Application Priority Data

Jun. 27, 2016 (JP) .................. 2016-126969

(51) Int. Cl.
| | | |
|---|---|---|
| B29C 43/58 | (2006.01) | |
| B29C 35/08 | (2006.01) | |
| G03F 9/00 | (2006.01) | |
| H01L 21/027 | (2006.01) | |
| H01L 21/56 | (2006.01) | |
| G03F 7/00 | (2006.01) | |

(52) U.S. Cl.
CPC .......... *B29C 43/58* (2013.01); *B29C 35/0805* (2013.01); *G03F 9/7076* (2013.01); *H01L 21/027* (2013.01); *H01L 21/565* (2013.01); *G03F 7/0002* (2013.01); *G06T 2207/30148* (2013.01)

(58) Field of Classification Search
CPC ....... B29C 43/58; B29C 35/04; H01L 21/027; G03F 7/0002; G03F 7/00
See application file for complete search history.

(56) References Cited

U.S. PATENT DOCUMENTS

| | | | | |
|---|---|---|---|---|
| 6,492,135 | B1* | 12/2002 | Larsen | .................. C12M 29/18 |
| | | | | 435/293.1 |
| 7,377,959 | B2* | 5/2008 | Kozaki | ................ B01D 53/002 |
| | | | | 95/142 |
| 2005/0116979 | A1* | 6/2005 | Takano | .................. B41J 2/1433 |
| | | | | 347/19 |
| 2006/0108721 | A1* | 5/2006 | Weaver | ..................... C21B 7/14 |
| | | | | 266/90 |

(Continued)

FOREIGN PATENT DOCUMENTS

| | | |
|---|---|---|
| JP | H10-009811 A | 1/1998 |
| JP | 2010-18022 A | 1/2010 |

(Continued)

*Primary Examiner* — Maurice C Smith (74) *Attorney, Agent, or Firm* — Canon U.S.A., Inc. IP Division (57) ABSTRACT

A discharge apparatus includes a discharge unit and a detection unit. The discharge unit is configured to discharge liquid containing a volatile compound from a discharge port. The detection unit is configured to detect discharge of the liquid by detecting, using light, a volatile component volatilizing from the liquid when the liquid is discharged from the discharge port.

15 Claims, 9 Drawing Sheets

(56) References Cited

U.S. PATENT DOCUMENTS

| | | | | |
|---|---|---|---|---|
| 2006/0268256 A1* | 11/2006 | Kolesnychenko | ..... | B82Y 10/00 355/78 |
| 2007/0263212 A1* | 11/2007 | Mound | .............. | G01N 21/3563 356/326 |
| 2009/0104720 A1* | 4/2009 | Seo | ........................ | G03F 7/162 438/7 |
| 2012/0134559 A1* | 5/2012 | Suzuki | ............... | G01N 15/1404 382/128 |
| 2012/0244719 A1* | 9/2012 | Hatano | ................ | G03F 7/0002 438/759 |
| 2014/0169081 A1* | 6/2014 | Zhao | .................... | H01L 27/222 365/158 |
| 2014/0260963 A1* | 9/2014 | Wang | ................ | B01D 35/02 95/8 |
| 2016/0190004 A1* | 6/2016 | Song | ................ | H01L 21/31144 438/618 |

FOREIGN PATENT DOCUMENTS

| | | | |
|---|---|---|---|
| JP | 2012-212833 A | 11/2012 | |
| JP | 2013-226699 A | 11/2013 | |

\* cited by examiner

DISCHARGE APPARATUS, IMPRINT APPARATUS, METHOD OF DETECTION, METHOD OF DETERMINATION, AND METHOD FOR MANUFACTURING ARTICLE

BACKGROUND OF THE INVENTION

Field of the Invention

The present disclosure relates to a discharge apparatus, an imprint apparatus, a method of detection, a method of determination, and a method for manufacturing an article.

Description of the Related Art

There is a known discharge apparatus including a discharge unit that discharges liquid from discharge ports to apply the liquid onto an object facing the discharge port and a detection unit (detector) that detects whether liquid has been discharged from the discharge ports. Japanese Patent Laid-Open No. 2010-18022 discloses a technique of emitting light while discharged liquid is flying and determining whether liquid has been discharged from a change in the output of a light receiving element that receives the light scattered by the liquid.

The technique disclosed in Japanese Patent Laid-Open No. 2010-18022 needs to provide light onto the flying path of the discharged liquid, that is, directly below the discharge ports. This is likely to limit the location of a unit that emits light for the detection or the light receiving element.

SUMMARY OF THE INVENTION

One disclosed aspect of the embodiments is a technique for detecting discharge of liquid, in a case where the liquid contains a volatile compound, using a new phenomenon without emitting light to a portion directly below an ejection port where the discharge liquid is flowing.

Accordingly, the present disclosure provides a discharge apparatus in which limitations on the layout of a unit that emits light for use in determination are reduced in determining whether liquid containing a volatile compound has been discharged.

A discharge apparatus according to an aspect of the present disclosure includes a discharge unit and a detection unit. The discharge unit is configured to discharge liquid containing a volatile compound from a discharge port. The detection unit is configured to detect discharge of the liquid by detecting, using light, a volatile component volatilizing from the liquid when the liquid is discharged from the discharge port.

Further features of the disclosure will become apparent from the following description of exemplary embodiments with reference to the attached drawings.

DESCRIPTION OF THE EMBODIMENTS

First Embodiment

Configuration of Imprint Apparatus

Although an embodiment in which a discharge apparatus according to an embodiment of the present disclosure is used in an imprint apparatus will be described, the present disclosure can also be used in other discharge apparatuses, as will be described below.

Figure 1:
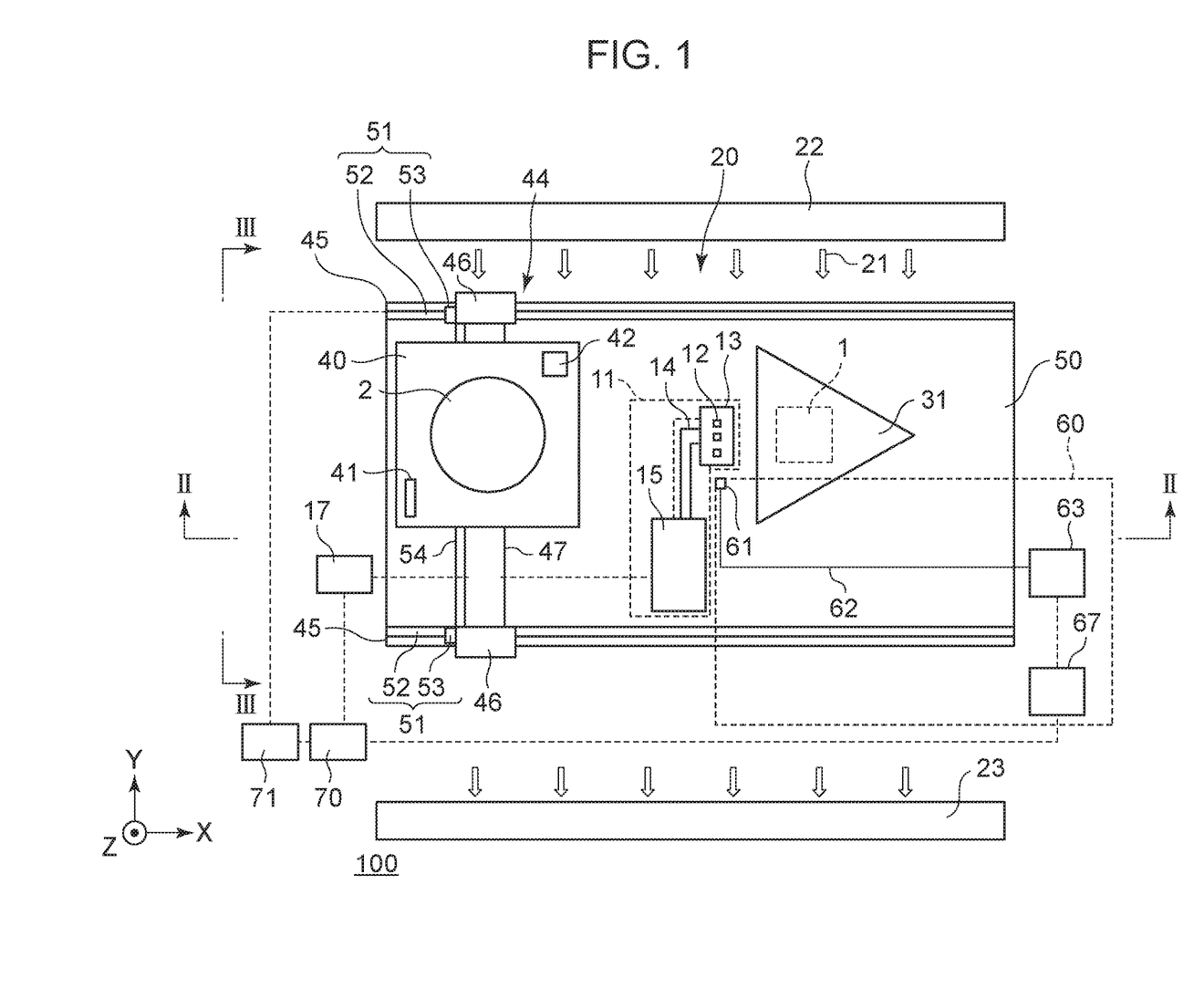
FIG. 1 is a diagram (top view) illustrating the configuration of an imprint apparatus according to a first embodiment of the present disclosure.
Figure 2:
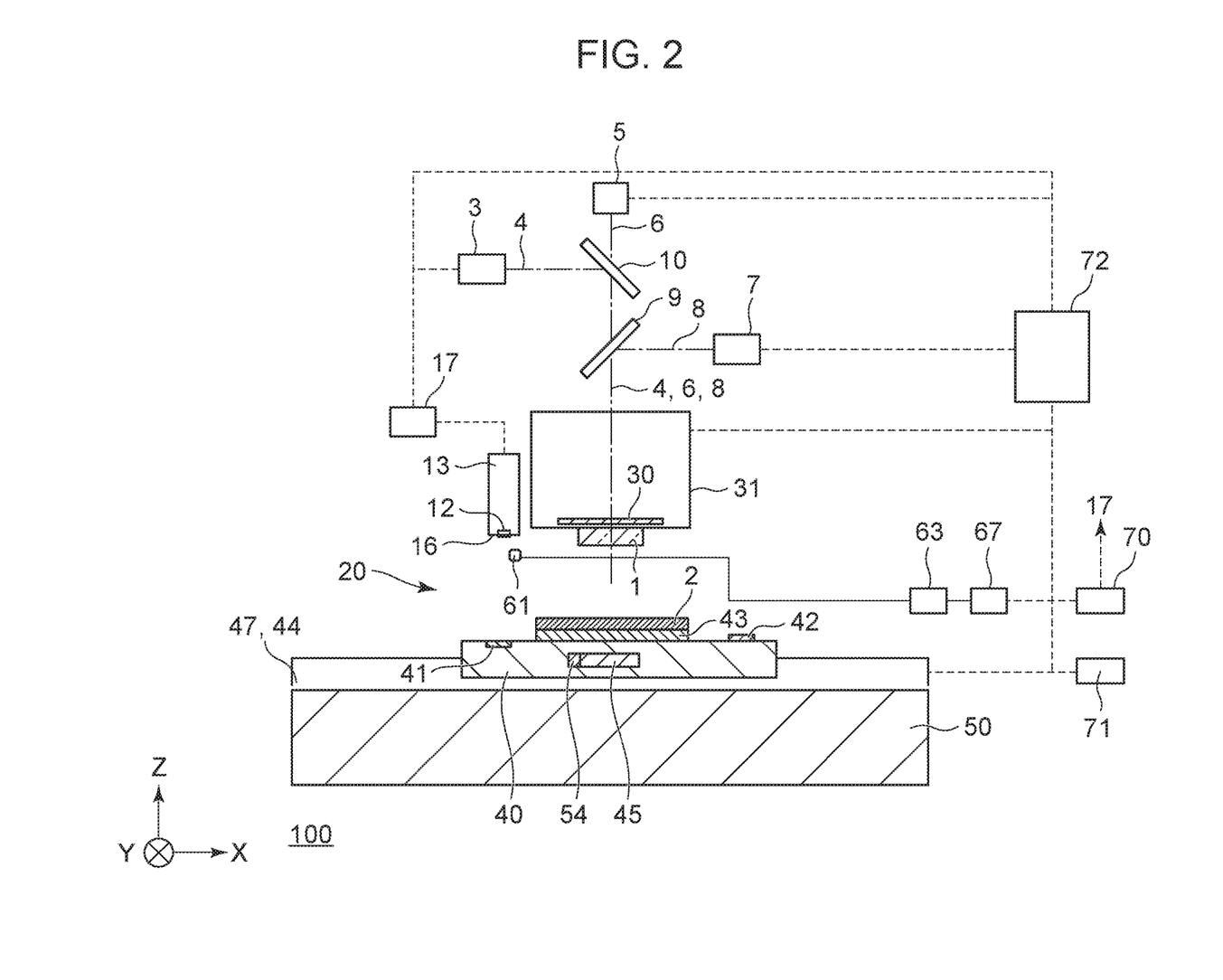
FIG. 2 is a diagram illustrating the configuration of the imprint apparatus (a sectional view taken from arrows II-II in FIG. 1).
Figure 3:
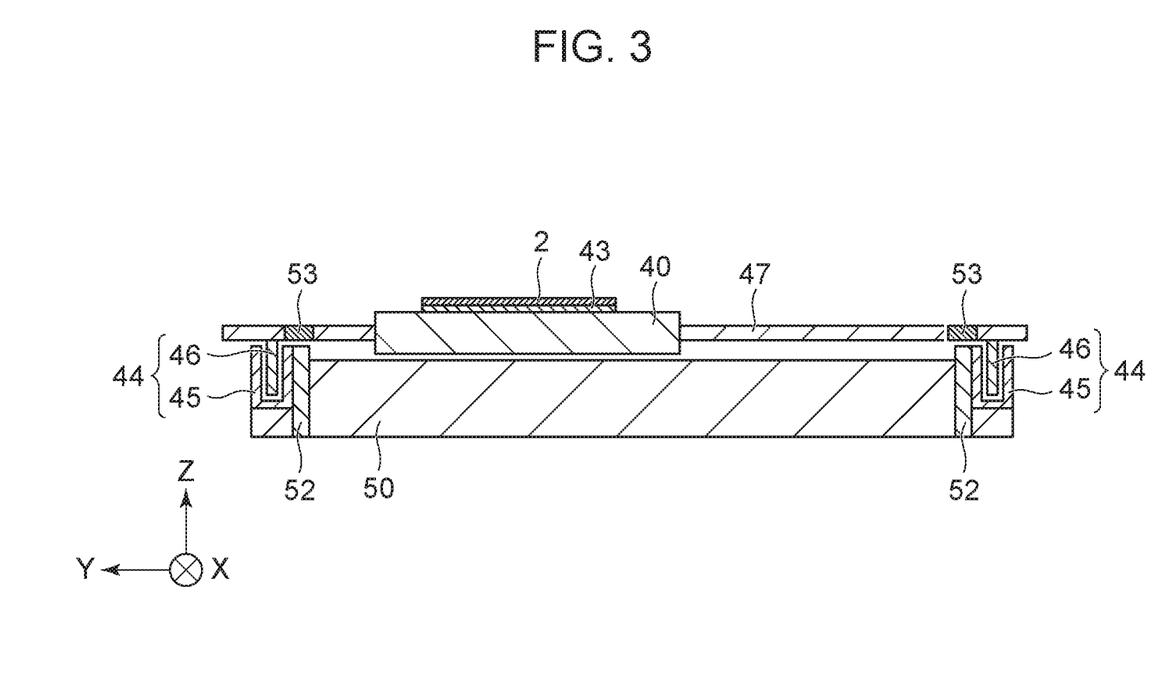
FIG. 3 is a diagram illustrating a configuration around a stage (a sectional view taken from arrows III-III in FIG. 1).

The configuration of an imprint apparatus 100 that forms a pattern of an imprint material on a substrate 2 using a mold 1 according to a first embodiment will be described with reference to FIGS. 1 to 3. FIG. 1 is a diagram (top view) illustrating the configuration of the imprint apparatus 100, FIG. 2 is a sectional view taken from arrows II-II in FIG. 1, and FIG. 3 is a diagram illustrating a configuration around a stage 40 of a sectional view taken from arrows III-III in FIG. 1. In the diagrams described below, an axis parallel to a vertical direction is Z-axis, and two axes orthogonal to each other in a plane perpendicular to the Z-axis are X-axis and Y-axis.

The imprint apparatus 100 is an apparatus that forms a pattern of a cured product by bringing an imprint material (for example, a light curable composition) applied onto the substrate 2 into contact with the mold 1 and giving curing energy to the imprint material. A pattern forming unit for forming the pattern is a component, such as a mold driving mechanism 31 (described later) engaged in the operation of bringing the mold 1 and the imprint material into and out of contact with each other.

The imprint material is made of a curable composition (also referred to as uncured resin) that is cured upon application of curing energy. Examples of the curing energy include an electromagnetic wave and heat. Examples of the electromagnetic wave include light, such as infrared rays, visible light, and ultraviolet rays of wavelengths selected from the range of 10 nm or more and 1 mm or less.

The curable composition is a composition that is cured upon application of light or by heat. Among them, a light curable composition that is cured by light contains at least a polymerizable compound and a photopolymerization initiator and may further contain a non-polymerizable compound or a solvent as needed. The non-polymerizable compound is at least one kind selected from a group of a sensitizer, a hydrogen donator, an internal mold release agent, a surface-active agent, an anti-oxidant, and a polymer component. The viscosity of the imprint material (the viscosity at 25° C.) is, for example, 1 mPa·s or more and 100 mPa·s or less.

In the present embodiment, the imprint material contains a volatile compound that is easy to evaporate in the imprint apparatus 100, has a different refractive index from air, and is cured when irradiated with light having a predetermined wavelength.

The imprint apparatus 100 includes an irradiation unit 3 that applies light 4 that can cure the imprint material toward the substrate 2 as a curing unit for curing the imprint material by providing energy.

An observing unit 5 is used to observe the imprint material adherent on the substrate 2. The observing unit 5 observes the imprint material on the substrate 2 by applying light 6 having a wavelength at which the imprint material is not cured to the substrate 2 and then receiving reflected light from the substrate 2. The observing unit 5 observes how the imprint material spreads in a space between the mold 1 and the substrate 2 during the imprinting process. The observing unit 5 may detect a foreign object between the mold 1 and the substrate 2 from the spread condition.

The mold 1 may be made of a material that can transmit the light 4, the light 6, and light 8 described later. Examples include quartz glass, silicate glass, calcium fluoride, magnesium fluoride, and acrylic glass. Alternatively, the mold 1 may be made of a resin material that can transmit the light 4, 6, and 8 or a laminate of these materials.

A measuring unit 7 detects a mark indicating the position of a shot area formed on the substrate 2 and a mark (not shown) formed on the mold 1 using the light 8 to measure the gap between the relative positions of the shot area and the mold 1. The measuring unit 7 also measures the position of the substrate 2 relative to the stage 40 by detecting a reference mark 42 described later.

The dichroic mirror 9 transmits the light 4 and reflects the light 8 toward the substrate 2. A dichroic mirror 10 reflects the light 4 toward the substrate 2 and transmits the light 6.

A supply unit 11 that supplies the imprint material to the substrate 2 includes a discharge section or a discharger (a discharge unit) 13 that has a discharge port 12 and that discharges the imprint material from the discharge port 12, a pipe 14 connected to the discharge section 13, and a tank 15. The tank 15 contains an uncured imprint material and supplies the imprint material to the discharge section 13 through the pipe 14. The discharge apparatus according to the present embodiment includes at least the discharge section 13 and a detection unit, or a detector, 60, described later, that detects discharge of the imprint material from the discharge port 12.

One or a plurality of discharge ports 12 are disposed in a Y-axis direction on the lower surface 16 of the discharge section 13. The supply unit 11 may be configured so that the imprint material circulates in the tank 15, the pipe 14, and the discharge section 13.

The discharge section 13 discharges the uncured imprint material on the basis of an instruction for discharge from an instruction unit (instruction issuer) 17. The instruction unit (instruction issuer) may issue an instruction for discharge. In a case where the discharge section 13 has a plurality of discharge ports 12, the instruction unit 17 may provide an instruction for discharge in such a manner as to control whether to discharge the imprint material from the discharge ports 12 individually or in a lump.

The discharge section 13 has a structure for discharging the imprint material by, for example, a piezo method. The instruction unit 17 inputs a control signal, such as an electrical signal, to the discharge section 13 to provide an instruction for discharge. When the discharge section 13 normally operates, the discharge section 13 drives piezoelectric elements disposed in correspondence with the discharge ports 12 on the basis of an instruction for discharge input from the instruction unit 17 at a predetermined timing. As the piezoelectric elements are driven, the imprint material is discharged from the discharge ports 12.

The imprint material discharged from the discharge section 13 is supplied onto the substrate 2 in a droplet form or the form of an island or film formed by connecting a plurality of droplets. The amount of the imprint material discharged from one discharge port 12 by one discharge operation is, for example, sub-nanoliter to sub-picoliter order.

The pressure in the discharge section 13 is set according to the kind and the viscosity of the imprint material and the ambient temperature of a space 20 outside the discharge section 13. The pressure in the vicinity of the discharge ports 12 in the discharge section 13 may be set so as to be negative relative to the pressure in the space 20. This causes the interface between the imprint material in the discharge section 13 and the space 20 is curved upward, making it difficult for the imprint material to leak out of the discharge ports 12.

The term "discharge" means that the imprint material is discharged from the interior of the discharge section 13 to the outside via the discharge ports 12. In other words, "discharge" includes not only a normal discharge operation performed by driving the piezoelectric elements but also a discharge due to an impact on the discharge section 13, a change in ambient pressure, or the like. For example, "discharge" also includes a phenomenon in which the imprint material leaking from the discharge ports 12 wets the lower surface 16 and a phenomenon in which a leaked imprint material falls directly below the discharge ports 12.

The discharge section 13 regularly discharges the imprint material into a waste dump 41 to prevent the discharge ports 12 from clogging. The waste dump 41 may have a structure that can be closed during a period other than at the operation of disposing the imprint material or a suction mechanism for sucking the imprint material and discharging it to the outside during the operation of disposing the imprint material.

A mold holding unit 30 holds the mold 1, and the mold driving mechanism 31 moves the mold holding unit 30 and the mold 1. The mold driving mechanism 31 moves the mold 1 mainly in the Z-axis direction during an operation of bringing the mold 1 into contact with the imprint material (an impressing operation). The mold driving mechanism 31 may have a driving mechanism for moving the mold 1 in the X-axis direction, the Y-axis direction, or rotation directions about the individual axes. Examples of an actuator for use in the mold driving mechanism 31 include a voice coil motor and an air cylinder.

The stage 40 moves above a platen 50 while supporting the substrate 2. On the top of the stage 40, the waste dump 41, the reference mark 42, and a substrate holding unit 43 are disposed. The substrate holding unit 43 is connected to a vacuum pump (not shown) and holds the substrate 2 by attracting the substrate 2 to the substrate holding unit 43 by reducing the pressure between the substrate holding unit 43 and the substrate 2. The reference mark 42 is a mark for use as a reference for obtaining positional information on the stage 40. The substrate holding unit 43 may hold the substrate 2 using an electrostatic force or mechanically.

The driving mechanism 44 is a mechanism for moving the stage 40 according to a control signal (a movement control signal). Although the present embodiment uses a linear motor as an actuator for the driving mechanism 44, a planar pulse motor may be used.

The driving mechanism 44 includes two X-stators 45 disposed in the X-axis direction on the sides of the platen 50, X-movable elements 46 that can be moved along the X-stators 45, a Y-stator 47 passing through the stage 40 in the Y-axis direction, and a Y-movable element (not shown) that can be moved along the Y-stator 47.

The Y-stator 47 includes a plurality of coils disposed in parallel in the Y-axis direction (not shown). The two X-stators 45 each include a plurality of coils (not shown) disposed in parallel in the X-axis direction, as the Y-stator 47 does. However, the plurality of coils disposed in parallel in the X-axis direction are disposed so that the directions in which the magnetic forces are generated from the individual coils are perpendicular to the directions of magnetic forces generated from the coils of the Y-stator 47.

Having described an example in which coils are used as the X-stators 45 and the Y-stator 47 and magnets are used as the X-movable elements 46 and the Y-movable element, the coils and the magnets may be used oppositely.

The imprint apparatus 100 includes a position measuring unit that measures the position of the stage 40. In the present embodiment, encoders 51 serve as the position measuring unit.

The encoders 51 each include an X-scale 52 having a diffractive grating on the upper surface thereof and an X-head 53 that moves together with the stage 40 along the X-scale 52. Each encoder 51 further includes a Y-scale 54 disposed along the Y-stator 47 and having a diffractive grating on the upper surface thereof and a Y-head (not shown) that moves along the Y-scale 54 together with the stage 40.

The X-head 53 includes a light emitting element (not shown) that emits light to the X-scale 52 and a light receiving element (not shown) that receives diffracted light from the X-scale 52. The Y-head also includes a light emitting element (not shown) that emits light to the Y-scale 54 and a light receiving element (not shown) that receives diffracted light from the Y-scale 54.

As a current flows through the coils in positions of the X-stator 45 and the Y-stator 47 according to a control signal from a control unit 72, described later, the stage 40 is positioned by the driving mechanism 44. Feed-back and/or feed-forward follow-up control of the stage 40 is performed on the basis of the result of measurement of the encoders 51 and a position command value.

Having described an example in which the driving mechanism 44 moves the stage 40 in an X-Y plane, the imprint apparatus 100 may have a mechanism for moving the stage 40 in the Z-axis direction. In the case where the stage 40 is movable also in the Z-axis direction, the impressing operation may be performed by moving at least one of the mold 1 and the substrate 2 in the Z-axis direction.

The imprint apparatus 100 includes, as an air conditioner for the space 20, a blowing unit 22 that blows gas 21 into the space 20 and an exhaust unit 23 that exhausts gas in the space 20. The blowing unit 22 blows the gas 21 through a chemical filter (not shown), a particle filter (not shown), or the like to keep the space 20 clean.

If the speed of the gas 21 blown from the blowing unit 22 is too low, particles will stay in the space 20, and if the speed is too high, the volatile component of the imprint material supplied to the substrate 2 above an allowable level will be vaporized. To prevent it, the speed of the gas 21 blown from the blowing unit 22 is preferably from about 0.5 to 4.0 m/sec. The blowing unit 22 further has a function of a flow generating unit for generating a gas flow that guides a component evaporated from the imprint material (hereinafter referred to a volatile component) to the detection unit 60 by generating a gas flow in the space 20 that the discharge ports 12 face.

The detection unit 60 detects the volatile component using light to detect discharge of the imprint material. The detection unit 60 includes a recovery section 62 that recovers the gas in the space 20 through a recovery port 61, a detecting section 63 that detects discharge of the imprint material, and a processing section 67 that processes the result of detection performed by the detecting section 63. The recovery section 62 is connected to a vacuum pump (not shown) via the detecting section 63 and recovers the gas by reducing the pressure the space in the vicinity of the recovery port 61.

Figure 4:
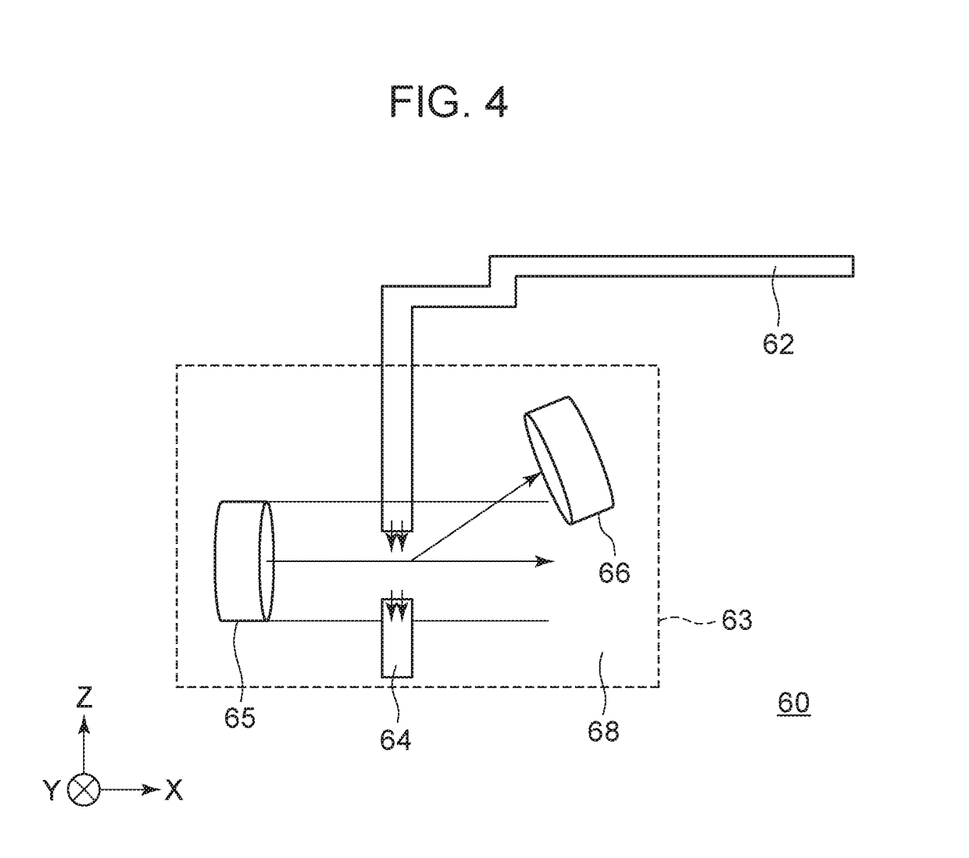
FIG. 4 is a diagram illustrating the configuration of a detection unit.

FIG. 4 is a diagram illustrating the configuration of the detection unit 60. The detecting section 63 includes an exhaust section 64 that sucks the gas guided into a detection space 68 by the recovery section 62 to exhaust it to the outside, a phototransmitter 65 that throws detecting light into the detection space 68, and a photoreceptor 66 that receives scattered light, which is part of the detecting light. An example of the detecting light is preferably infrared light in the range from about 700 nm to 1,000 nm.

The photoreceptor 66 receives scattered light regardless of the presence of particles even when the gas in the detection space 68 contains a component having a different refractive index from that of the gas 21. This is because, when the imprint material is discharged from the discharge section 13, a gaseous volatile component or a condensed liquid (mist) volatile component in the imprint material is conveyed by the flow of the gas 21 blown out from the blowing unit 22.

In a case where the volatile component in the imprint material is in a gaseous state, when the gas containing the volatile component of the imprint material enters the detection space 68, the refractive index in the detection space 68 changes more than that when only the gas 21 is present in the detection space 68. In the case where the volatile component of the imprint material is locally present, the detecting light refracts at the boundary between the gas 21 and the volatile component of the imprint material. As a result, the photoreceptor 66 receives, as scattered light, part of the detecting light coming from the phototransmitter 65, which is changed in direction by the interaction with the volatile component of the imprint material.

In a case where the volatile component of the imprint material condenses into liquid, the liquid volatile component of the imprint material acts like the above-described particles. This scatters part of the detecting light coming from the phototransmitter 65, so that the photoreceptor 66 receives the scattered light. In the case where the volatile component of the imprint material comes into a liquid state, the imprint material can contain a component other than the volatile component.

In the case where the volatile component of the imprint material is present in the detection space 68, the amount of light received by the photoreceptor 66 is larger than that when the volatile component is not present in the detection space 68. In other words, the amount of light received by the photoreceptor 66 increases when the imprint material is discharged from the discharge section 13 or with some delay from the discharge. The increase in the amount of received light can occur until the volatile component of the imprint material is exhausted by the exhaust unit 23 or until the imprint material is cured by the irradiation unit 3. The detection unit 60 according to the present embodiment indirectly detects discharge of the imprint material by detecting a change in the amount of received light using this phenomenon.

The processing section 67 compares the amount of light received by the photoreceptor 66 and a predetermined threshold value, and when the amount exceeds the threshold value, the processing section 67 notifies a determination unit 70 that the imprint material has been discharged. The threshold value is set higher than the amount of light received by the photoreceptor 66 in a state in which no imprint material is discharged from the discharge section 13 and lower than the amount of light received by the photoreceptor 66 in a state in which the imprint material is discharge from the discharge section 13.

The detecting section 63 has a similar structure to that of a generally known particle counter. Therefore, the particle counter can be used as the detecting section 63. In this case, discharge of the imprint material is detected on the basis of the number of output particles.

In the case where a particle counter is used as the detecting section 63, a particle counter for an environment at ISO cleanliness Class 1 or Class 2 suitable for an operation of the imprint apparatus 100 may be used.

Referring back to FIGS. 1 to 3, the recovery port 61 is disposed so that the volatile component of the imprint material can be guided to the detection unit 60 in order that the detection unit 60 can detect the volatile component contained in the gas in the space 20. Specifically, the recovery port 61 is disposed downstream from the discharge section 13 in the direction of the flow of the gas 21 blown from the blowing unit 22 (in FIG. 1, a direction containing a component in the −Y-direction). The recovery port 61 may be disposed at an X-position near the X-position of the discharge section 13 and at a Z-position near the Z-position of the discharge section 13.

This allows the detection unit 60 to efficiently recover the gas containing the volatile component of the imprint material and to detect the volatile component of the imprint material contained in the gas in the space 20 with high sensitivity. When the detection sensitivity of the photoreceptor 66 is within an allowable range, the recovery port 61 may be disposed nearer to the exhaust unit 23 than the discharge section 13 in the Y-axis direction.

The determination unit 70 includes a central processing unit (CPU) and a memory (a read-only memory [ROM] or a random-access memory [RAM]) (not shown). The memory of the determination unit 70 stores a program of a method for determining whether the discharge section 13 has an abnormality, illustrated in the flowchart of FIG. 5. The determination unit 70 determines, by reading the program, whether the discharge section 13 has an abnormality on the basis of an instruction for discharge from the instruction unit 17 and the result of detection performed by the detection unit 60.

The abnormality of the discharge section 13 refers to an abnormal discharge failure in which no imprint material is discharged although a control signal indicating an instruction for discharge is input or an abnormal discharge of an imprint material in which an imprint material is discharged although the discharge does not correspond to the control signal (hereinafter referred to as abnormal discharge).

When the determination unit 70 determines that the imprint material has been abnormally discharged, an estimation unit (a position estimating unit) 71 estimates a position where the imprint material adheres on the basis of a control signal that controls the movement of the stage 40 and the timing at which the detection unit 60 detects the abnormal discharge of the imprint material.

The control unit 72 is connected to the irradiation unit 3, the observing unit 5, the measuring unit 7, the discharge section 13, the mold driving mechanism 31, the blowing unit 22, the exhaust unit 23, the driving mechanism 44, the detecting section 63, the determination unit 70, and the estimation unit 71. The control unit 72 includes a CPU, a memory (a ROM or a RAM) (not shown), and so on. The memory stores, for example, a program for the imprinting process illustrated in part of FIG. 9. The control unit 72 controls the components connected to the control unit 72 according to the program stored in the memory as a whole.

The imprint apparatus 100 executes an imprinting process, described in detail below, according to the instructions of the control unit 72. The imprinting process is a process of repeating supply of an imprint material from the supply unit 11 to the substrate 2, an impressing operation using the mold driving mechanism 31, curing of the imprint material using the irradiation unit 3, and a mold releasing operation using the mold driving mechanism 31. The control unit 72 may be a collective entity of separate control substrates or a single control substrate that has the function to be executed by the control unit 72. At least one of the functions of the determination unit 70 and the estimation unit 71 may be executed by the control unit 72.

Method for Determining Presence of Abnormality

The detection unit 60 continues to detect whether the volatile component of the imprint material is present in the gas recovered by the recovery section 62 during the period from when the substrate 2 is loaded until unloaded. The detection may be performed intermittently or may be performed while the discharge section 13 is not supplying the imprint material to the substrate 2 according to an instruction of the instruction unit 17.

Figure 5:
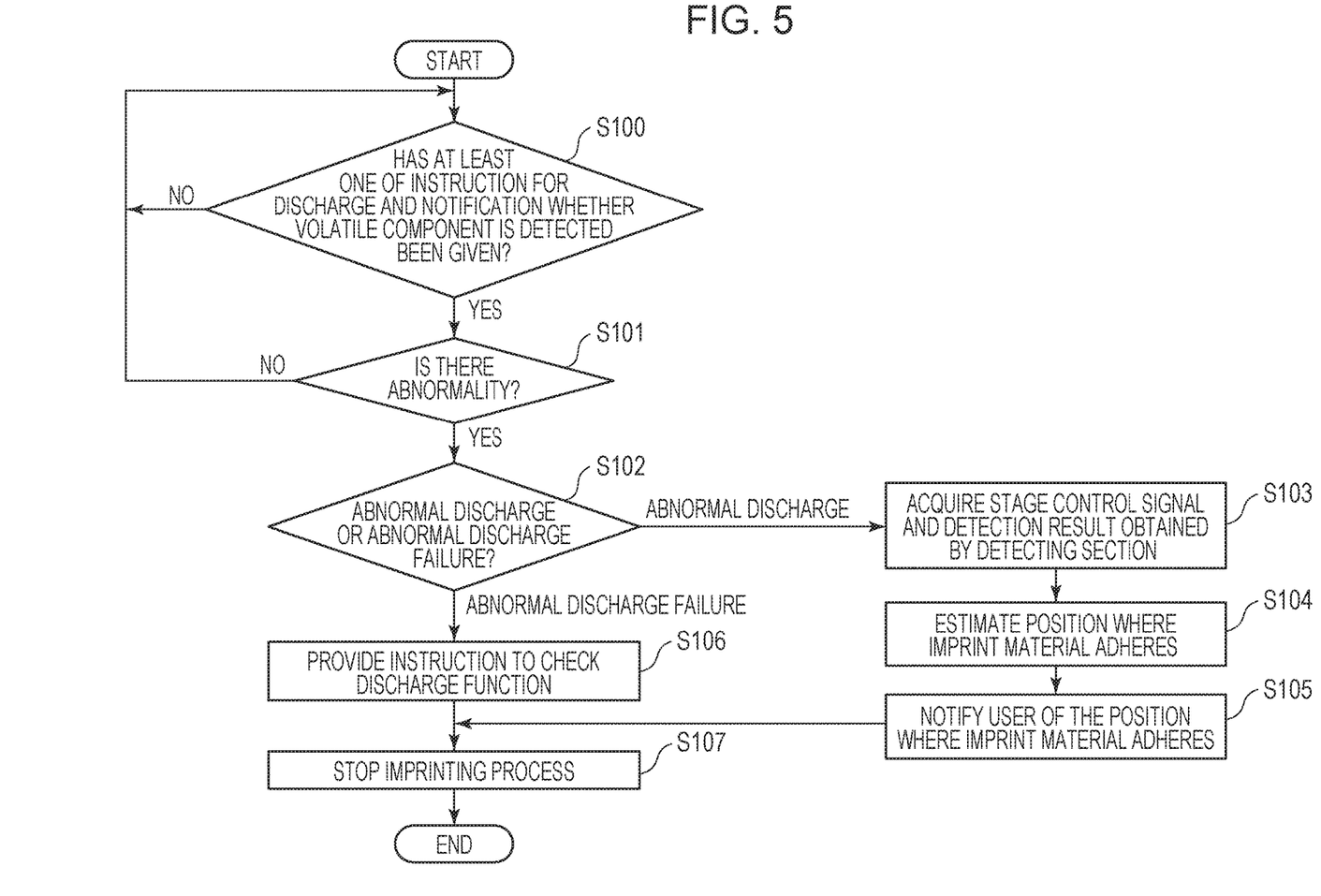
FIG. 5 is a flowchart illustrating a method for determination on the presence of abnormality.

FIG. 5 is a flowchart illustrating a method for determining whether the imprint material has been abnormally discharged from the discharge section 13. The determination unit 70 monitors whether at least one of an instruction from the instruction unit 17 to discharge the imprint material to the discharge section 13 and a notification from the detection unit 60 whether the imprint material has been discharged has been acquired (S100). If at least one notification is provided, then the determination unit 70 determines whether a discharge abnormality of the discharge section 13 has occurred (S101).

Figure 6A:
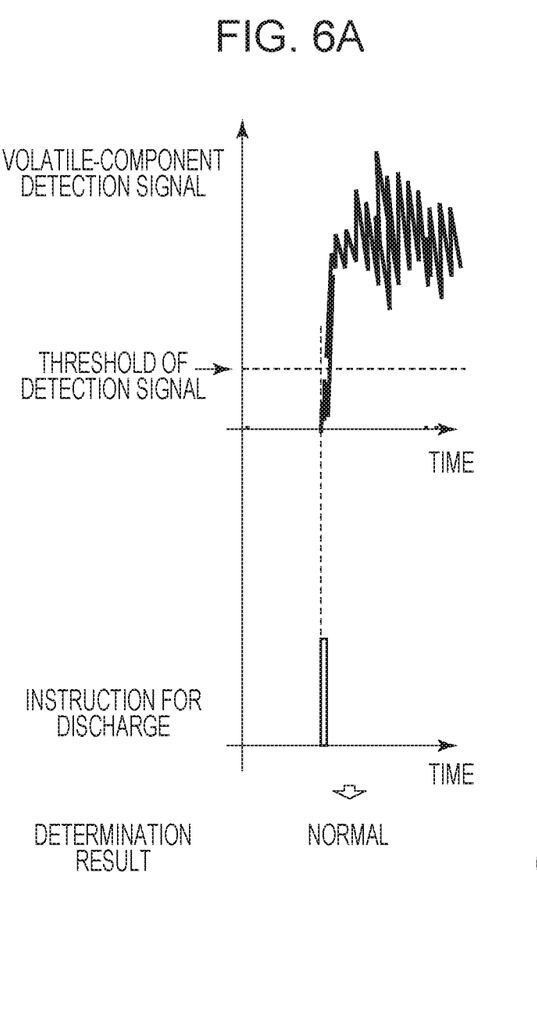
FIG. 6A is a first diagram on criteria for a determining unit.
Figure 6B:
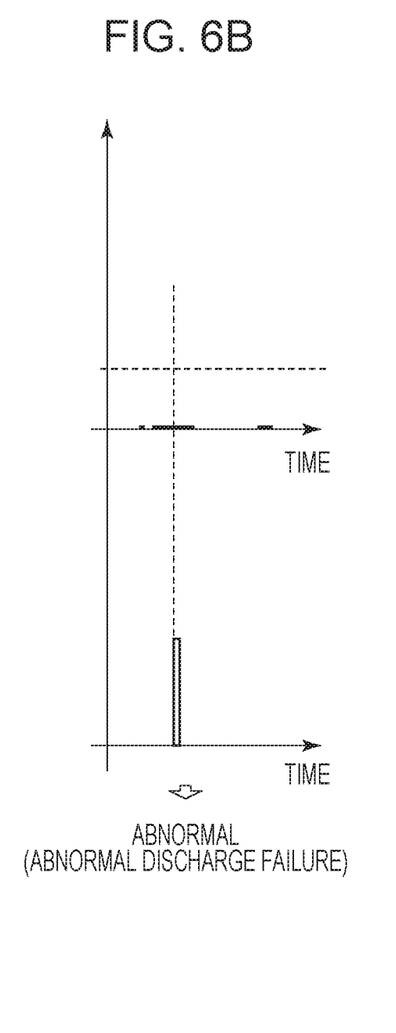
FIG. 6B is a second diagram on the criteria for the determining unit.
Figure 6C:
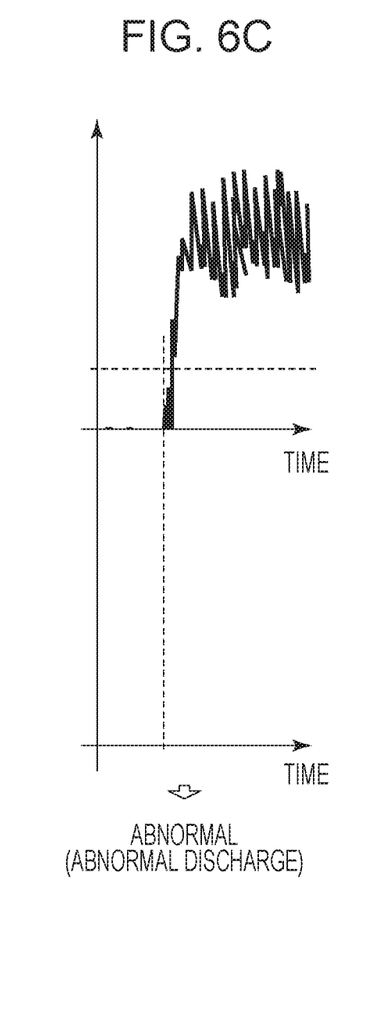
FIG. 6C is a third diagram on the criteria for the determining unit.

Criteria of the determination at S101 are illustrated in FIGS. 6A, 6B, and 6C. The upper stages of FIGS. 6A, 6B, and 6C indicate volatile component detection signals (on the vertical axis) against time (on the horizontal axis), and the lower stages indicate whether a signal indicating an instruction for discharge is present (on the vertical axis) against time (on the horizontal axis). As illustrated in FIG. 6A, when an instruction for discharge is provided to the discharge section 13, and the detection unit 60 detects discharge of the imprint material, the determination unit 70 determines that the discharge section 13 is normal (S101: No).

As illustrated in FIG. 6B, when an instruction for discharge is provided from the instruction unit 17, and the detection unit 60 detects no imprint material, that is, when an abnormal discharge failure has occurred, the determination unit 70 determines that there is an abnormality in the discharge section 13 (S101: Yes). As illustrated in FIG. 6C, also when an instruction for discharge is not provided from the instruction unit 17, and the detection unit 60 detects discharge of the imprint material, that is, when an abnormal discharge has occurred, the determination unit 70 determines that there is an abnormality in the discharge section 13 (S101: Yes).

At S101, sometimes a delay can occur in the detection of the volatile component of the imprint material from the instruction for discharge. For such occasions, the determination unit 70 may make a determination of Yes at the step of S101 when one of an instruction for discharge and a notification whether the imprint material has been discharged is not provided after the other is provided. The predetermined time is, for example, the time from the supply of the imprint material onto one shot area to completion of pattern formation to the imprint material on the shot area.

If the determination unit 70 determines that there is no abnormality in the discharge section 13 (S101: No), the process returns to the step of S100. If the determination unit 70 determines that there is an abnormality in the discharge section 13 (S101: Yes), the process goes to step S102, at which the determination unit 70 determines whether the abnormality is an abnormal discharge or an abnormal discharge failure.

If at S102 the determination unit 70 makes a determination of an abnormal discharge, the determination unit 70 notifies the estimation unit 71 of the determination. The estimation unit 71 acquires the history of the control signal for controlling the movement of the stage 40 from the control unit 72 and acquires information on the detection time of discharge of the imprint material from the detection unit 60 (S103). Furthermore, the estimation unit 71 estimates a position where the imprint material adheres (S104).

A method of estimation will be described. First, the estimation unit 71 acquires the position of the stage 40 from the control signal for the stage 40 at the timing (time) at which the detection unit 60 starts to detect discharge of the imprint material. The estimation unit 71 determines whether the adhesion position is on the stage 40 on the basis of whether the position of the stage 40 faces the discharge ports 12.

When the estimation unit 71 determines that the adhesion position of the imprint material is not on the stage 40, the estimation unit 71 estimates the adhesion position to be the platen 50. When the estimation unit 71 determines that the adhesion position of the imprint material is on the stage 40, the estimation unit 71 further determines which one of the reference mark 42, the substrate 2, the waste dump 41, and the other part on the stage 40 the position facing the discharge ports 12 is. The estimation unit 71 also functions as a notification unit and notifies the user of the estimated adhesion position via the control unit 72 and a user interface connected to the control unit 72 (S105).

If at S102 the determination unit 70 makes a determination of an abnormal discharge failure, then the determination unit 70 notifies the control unit 72 of the determination, and the control unit 72 provides an instruction to check the discharge function of the discharge section 13 (S106). A method of checking will be described later. This concludes the description of the method of determination on the presence of an abnormality in the discharge section 13.

After the step of S105 or S106, the imprint apparatus 100 stops the imprinting process according to an instruction from the control unit 72 (S107).

(1) In Case of Abnormal Discharge

After the user is notified of the adhesion position at S105, the user performs the following cleaning operation. The cleaning operation performed by the user may be replaced with a cleaning member (not shown) under an instruction of the control unit 72. An example of the cleaning is wiping off an uncured imprint material with nonwoven cloth damped with a solvent (for example, ethanol or acetone) capable of wiping off the uncured imprint material. Depending on the adhesion position of the imprint material, the imprint apparatus 100 executes a predetermined process.

(1-1) When the adhesion position is on the waste dump 41, the interior of the waste dump 41 is cleaned. In the case where a suction mechanism is provided, the imprinting process may be restarted without performing cleaning.

(1-2) When the adhesion position is on the reference mark 42, the top of the reference mark 42 is cleaned. This can prevent the reference mark 42 detected by the measuring unit 7 from becoming unclear as the imprint material adheres to the reference mark 42 to cause a measurement error.

(1-3) When the adhesion position is on the substrate 2, the driving mechanism 44 positions the stage 40 so that the adhesion position of the imprint material estimated by the estimation unit 71 faces the mold 1. It is determined whether the imprint material adheres to the top of the substrate 2 using the observing unit 5. After the adhesion is confirmed, the irradiation unit 3 applies the light 4 to cure the imprint material. Since no volatile component is generated after the curing, the volatile component of the imprint material is no longer detected, and therefore the imprinting process can be restarted. The observation using the observing unit 5 is not necessarily needed.

When the adhesion position is on the substrate 2, the substrate 2 may be unloaded from the imprint apparatus 100, with the imprint material kept in the uncured state. However, in this case, the unloaded substrate 2 may be disposed in a space separated from a substrate 2 on which an imprinting process is to be performed after the unloaded substrate 2. This prevents a pattern defect caused by solidification and drying of the imprint material and deposition on the substrate 2 on which an imprinting process has not yet been performed.

(1-4) When the adhesion position is on the platen 50, the stage 40 is stopped, and the top of the platen 50 is cleaned.

(1-5) When no imprint material adheres to an adhesion position estimated by the estimation unit 71, it is determined whether the lower surface 16 of the discharge section 13 is wet with the imprint material. If the lower surface 16 is wet, the lower surface 16 is cleaned.

When a component volatilized from a cleaning solvent enters the detection space 68 during cleaning, the detection unit 60 can erroneously detect discharge of the imprint material. For that reason, the imprinting process may be restarted according to an instruction from the control unit 72 after confirming that all the components of the cleaning solvent have been drained off due to the flow of the gas 21, so that the determination unit 3 no longer recognizes that the imprint material has been discharged.

(2) In Case of Abnormal Discharge Failure

When an abnormal discharge failure due to a transmission error of a discharge instruction signal is detected, it is determined whether the discharge function of the discharge section 13 is normal. The discharge section 13 supplies an imprint material onto the substrate 2, with any shot area on the substrate 2 opposed to the discharge section 13. The stage 40 is moved to a position facing the mold 1 by the driving mechanism 44, and the supplied imprint material is cured by the light 4 emitted from the irradiation unit 3. The cured imprint material is observed by the observing unit 5 to determine whether a normal discharge has been performed through all the discharge ports 12. When the result of observation shows that there is no abnormality, the imprinting process is restarted on another shot area.

As described above, the detection unit 60 can detect discharge of the imprint material by detecting, using light, the volatile component of the imprint material in the gas in the space 20. The detection unit 60 may be disposed at any position in and out of the imprint apparatus 100 provided that the recovery port 61 is disposed at a position where the gas containing the volatile component of the imprint material can be recovered. Thus, the detection unit 60 can detect discharge of the imprint material even if light is not emitted to a path on which the discharged imprint material is floating.

As a result, limitations on placement of members, such as the phototransmitter 65 that emits light, for detecting discharge of the imprint material can be made smaller than those of Japanese Patent Laid-Open No. 2010-18022.

Furthermore, a determination of whether discharge from the discharge section 13 is abnormal can be made on the basis of the control signal indicating an instruction for discharge to the discharge section 13 and the detection result of the detection unit 60.

Not only the discharge failure but also the abnormal discharge of the imprint material can be detected. This allows adhesion of the imprint material to be detected and removed at an early time. As a result, it can be prevented or reduced that the attached imprint material is dried to become a factor for increasing the particles in the space 20.

Having described an embodiment in which the determination unit 70 determines the occurrence of both of an abnormal discharge and an abnormal discharge failure, the determination unit 70 may make a determination of any one of them.

Second Embodiment

Figure 7:
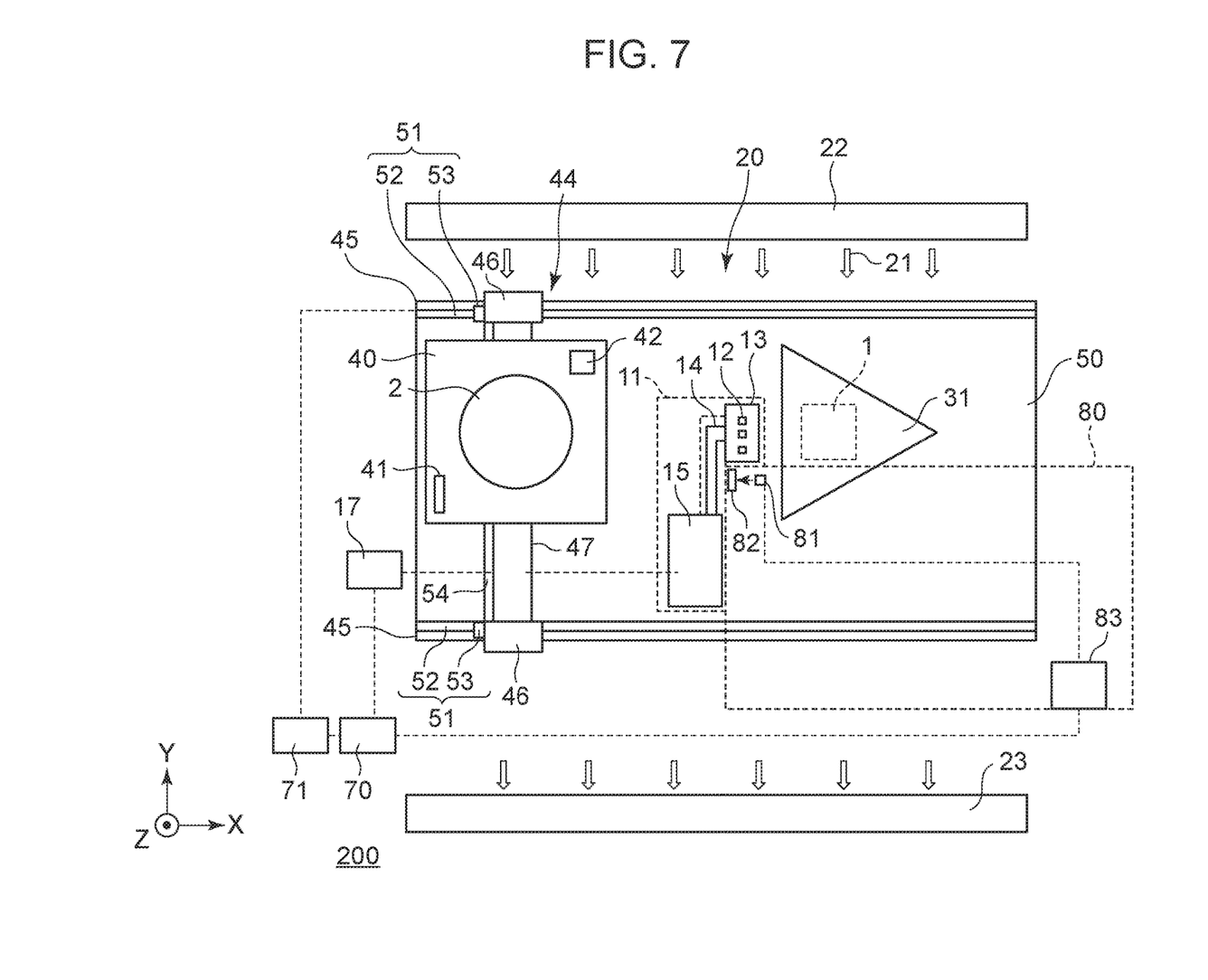
FIG. 7 is a diagram illustrating the configuration of an imprint apparatus according to a second embodiment.

FIG. 7 is a diagram illustrating the configuration of an imprint apparatus 200 according to a second embodiment. The imprint apparatus 200 includes a detection unit 80 as a detection unit for detecting discharge of an imprint material by determining whether the volatile component of the imprint material is contained in the gas in the space 20 using light. The other configurations are the same as those of the imprint apparatus 100. In FIG. 7, the same components as those in FIG. 1 are denoted by the same signs, and the detailed descriptions thereof will be omitted.

The detection unit 80 includes a measuring section 81, an object (a measurement object) 82 whose distance is to be measured by the measuring section 81, and a processing section 83 that processes the measurement result of the measuring section 81 to determine the presence of the volatile component of the imprint material. The measuring section 81 and the object 82 are opposed to each other across a space in which the volatile component of the imprint material is present when the imprint material is discharged.

It is only required that the measuring section 81 can measure the distance to the object 82 using light, for which, for example, a spectral interferometer (an interferometer) may be used. The measuring section 81 outputs the distance between the measuring section 81 and the object 82 on the basis of a predetermined refractive index of gas (for example, the refractive index of air).

The object 82 is an object at rest. Therefore, the actual distance between the measuring section 81 and the processing section 83 does not change. The object 82 is an object that reflects light emitted from the measuring section 81 to the measuring section 81. The object 82 may be an object having high light reflectivity, such as a mirror.

The measuring section 81 and the object 82 may be disposed in the −Y-direction with respect to the Y-position of the discharge section 13 so that the volatile component of the imprint material can easily enter the optical path of the measuring section 81 due to the gas flow from the blowing unit 22. Furthermore, the measuring section 81 and the object 82 may be disposed at an X-position near the X-position of the discharge section 13 and at a Z-position near the Z-position of the discharge section 13. The measuring section 81 and the object 82 may not only be disposed as in FIG. 7 but also disposed nearer to the −Y-direction.

Detection of discharge of an imprint material using the detection unit 80 will be described. When an imprint material is discharged from the discharge section 13, the gas in the space 20 contains the gas 21 and the volatile component of the imprint material. When the volatile component enters the optical path of the light emitted from the measuring section 81 to cause a change in refractive index in at least part of the optical path, the distance L' output from the measuring section 81 changes to $L'=L\pm\Delta L$, although the distance between the measuring section 81 and the object 82 does not change, where L is a distance that is output while no imprint material is discharged from the discharge section 13.

The processing section 67 compares the distance L' and the distance L to determine whether $\Delta L$ is equal to or greater than a threshold value. If $\Delta L$ is greater than the threshold value, then the processing section 67 determines that the gas in the space 20 contains the volatile component of the gas, that is, the imprint material has been discharged and notifies the determination unit 70 of the determination.

The determination unit 70 determines whether at least one of an instruction from the instruction unit 17 to the discharge section 13 and a notification that the gas in the space 20 contains the volatile component of the imprint material from the detection unit 80 has been provided and makes determinations of the same matters as of those of S100 to S102 described above.

As described above, the detection unit 80 can detect discharge of the imprint material by determining whether the volatile component of the imprint material is contained in the gas in the space 20 using light. Since it is only required that a determination whether the volatile component of the imprint material is contained is made, limitations on the placement of the measuring section 81 for the determination can be reduced.

Furthermore, a determination on the abnormality of the discharge from the discharge section 13 can be made on the basis of the control signal indicating an instruction for discharge to the discharge section 13 and the detection result of the detection unit 80. This prevents or reduces generation of a factor for increasing the particles in the space 20, as in the first embodiment.

Third Embodiment

Figure 8:
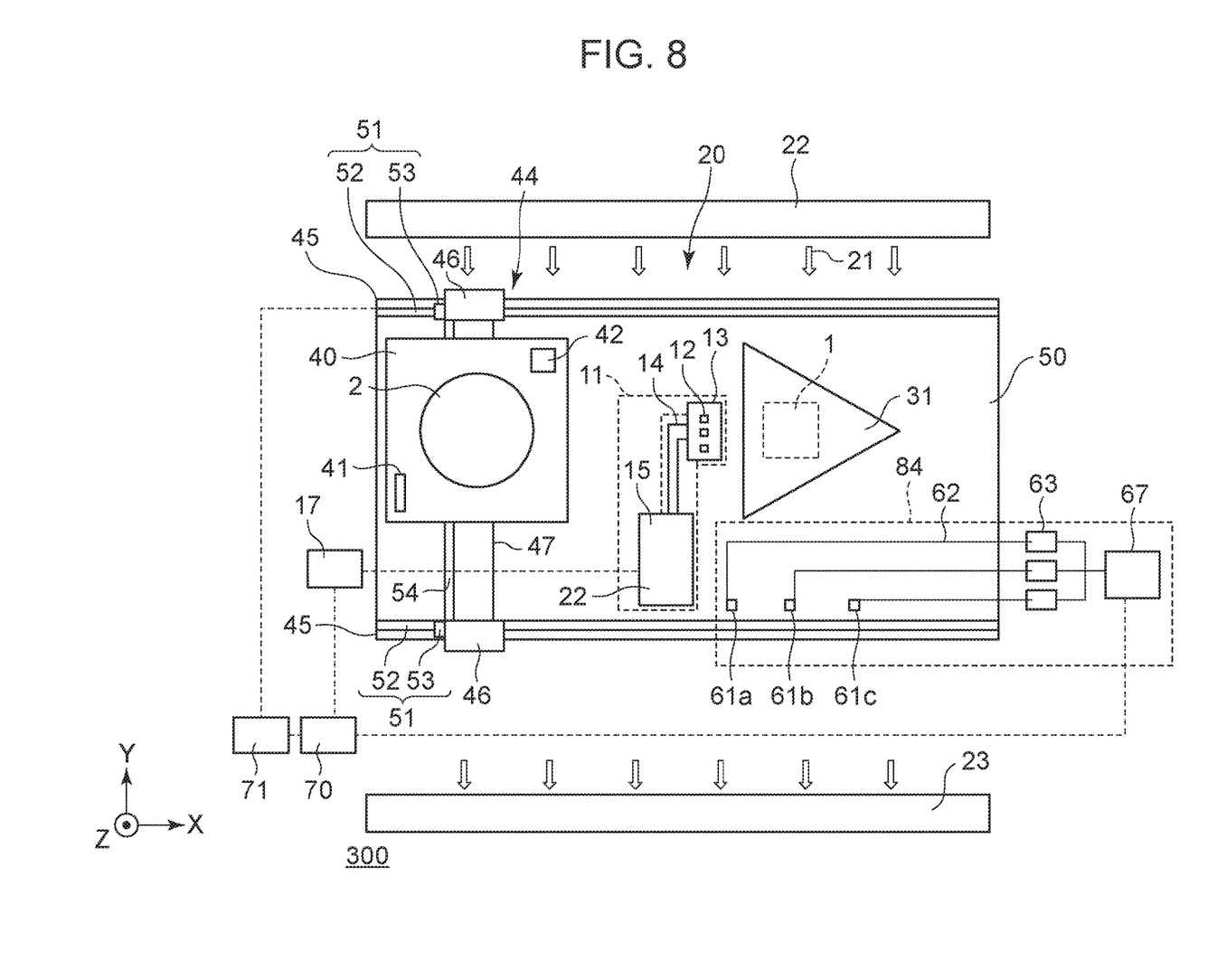
FIG. 8 is a diagram illustrating the configuration of an imprint apparatus according to a third embodiment.

FIG. 8 is a diagram illustrating the configuration of an imprint apparatus 300 according to a third embodiment. In FIG. 8, the same components as those in FIG. 1 are denoted by the same signs, and the detailed descriptions thereof will be omitted.

The imprint apparatus 300 includes a detection unit 84 as a detection unit for detecting discharge of an imprint material by determining whether the volatile component of the imprint material is contained in the gas in the space 20 using light. The determination unit 84 includes three recovery sections 62 that respectively include recovery ports 61a, 61b, and 61c, and three detecting sections 63 connected to the corresponding recovery sections 62. The recovery ports 61a, 61b, and 61c are disposed in the X-axis direction in such a manner as to increase in distance from the discharge section 13 in this order from the recovery port 61a.

The recovery ports 61b and 61c recover part of the volatile component of the imprint material even though disposed in X-positions different from the X-position of the discharge section 13. This is because the volatile component scatters in the X-axis direction and also in the −Y-direction with respect to the discharge section 13, that is, downstream from the discharge section 13 due to the gas 21.

The imprint apparatus 300 makes a determination on the abnormality of the discharge section 13 and an estimate of the adhesion position of the imprint material, as the imprint apparatus 100 does.

When the adhesion position of the imprint material is on the platen 50, the recovery port 61a recovers the volatile component of the imprint material most. As a result, the detecting section 63 connected to the recovery port 61a detects light due to the volatile component of the imprint material most, compared to the other detection unit 60.

When the adhesion position of the imprint material is on the stage 40, the detecting section 63 connected to the recovery port 61a nearest to the position of the stage 40 detects the amount of received light due to the volatile component of the imprint material most. As the stage 40 moves, the amount of received light due to the volatile component of the imprint material changes from moment to moment.

Thus, this embodiment not only provides the advantageous effects of the first embodiment but also allows a determination whether the estimation of the estimation unit 71 that the imprint material has adhered to the stage 40 is correct.

Other Embodiments

The substrate 2 is made of glass, ceramic, metal, a semiconductor, resin, or the like, on which a member made of a different material from that of the substrate 2 may be formed as needed. Specific examples of the substrate 2 include a silicon wafer, a compound semiconductor wafer, and a quartz glass. The mold 1 may be a mode for use in forming a pattern on a substrate in another imprint apparatus, on which no embossed patter is formed (a blank mold).

The discharge apparatuses described in the above embodiments may also be mounted on another apparatus, such as a coater of an adhesive containing a volatile component or a coater developer of resin containing a volatile component, in addition to the imprint apparatus.

Method for Manufacturing Article

A pattern of a cured product formed using an imprint apparatus can be permanently used for at least part of various articles or temporarily used for manufacturing various articles. Examples of the articles include electric circuit elements, optical elements, micro electro mechanical systems (MEMS), recording elements, sensors, and molds. Examples of the electric circuit elements include volatile or non-volatile semiconductor memories, such as a dynamic random access memory (DRAM), a static random access memory (SRAM), a flash memory, and a magnetoresistive random access memory (MRAM), and semiconductor devices, such as a large scale integration (LSI), a charge coupled device (CCD), an image sensor, and a field-programmable gate array (FPGA). One example of the mold is a mold for imprinting.

A pattern of a cured product is used as it is as at least part of the components of the article or temporarily used as a resist mask. The resist mask is removed after etching or ion implantation is performed during a substrate processing process.

FIGS. 9A to 9F are diagrams illustrating a method for manufacturing an article. In FIGS. 9A to 9F, only an area in which a pattern is formed by a single impressing operation is illustrated, and the other is omitted. FIGS. 9A to 9F illustrate the details of the above-described imprinting process (a method of imprinting).

Figure 9A:
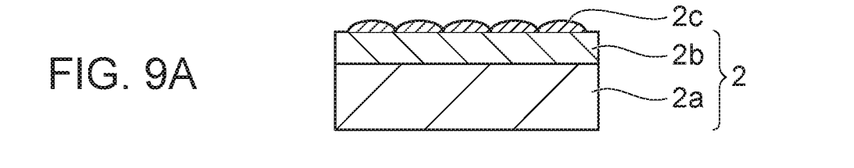
FIG. 9A is a diagram illustrating a first step of a method for manufacturing an article.

In FIG. 9A, the discharge section 13 supplies an imprint material 2c onto the surface of the substrate 2 in which a workpiece 2b, such as an insulator, is formed on a base material 2a. FIG. 9A illustrates a state in which the imprint material 2c in the form of a plurality of droplets is supplied on the substrate 2.

Figure 9B:
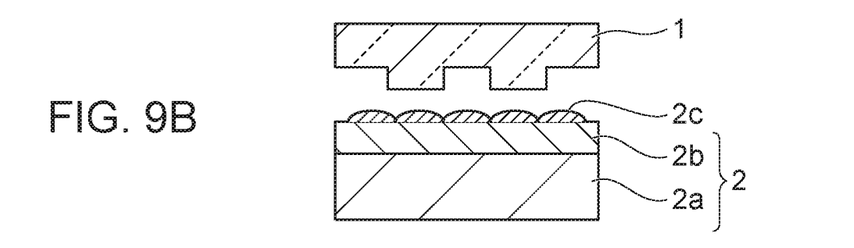
FIG. 9B is a diagram illustrating a second step of the method for manufacturing the article.

As illustrated in FIG. 9B, the surface of the mold 1 on which an embossed pattern is formed and the imprint material 2c on the substrate 2 are opposed to each other by moving the stage 40 with the driving mechanism 44.

Figure 9C:
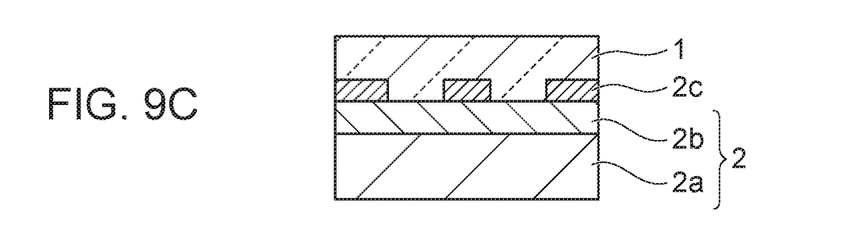
FIG. 9C is a diagram illustrating a third step of the method for manufacturing the article.

As illustrated in FIG. 9C, the mold 1 is moved downwards to bring the mold 1 into contact with the imprint material 2c. A predetermined pressure may be applied to the mold 1. The imprint material 2c fills the gap between the mold 1 and the workpiece 2b. When the irradiation unit 3 applies the light 4 through the mold 1 in that state, the imprint material 2c is cured.

Figure 9D:
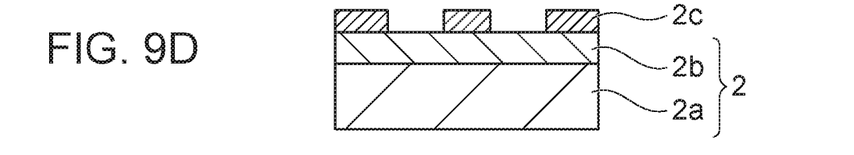
FIG. 9D is a diagram illustrating a fourth step of the method for manufacturing the article.

When the mold 1 and the substrate 2 are separated from each other after the imprint material 2c has been cured, a pattern of the cured product of the imprint material 2c is formed on the substrate 2, as illustrated in FIG. 9D. The pattern of the cured product has a shape in which the recesses of the mold 1 correspond to the protrusions of the cured product, and the protrusions of the mold 1 correspond to the recesses of the cured product. In other words, the reversed pattern of the embossed pattern of the mold 1 is formed on the imprint material 2c. The processes in FIGS. 9A to 9D are repeated until the pattern of the cured product is formed in all the areas of the substrate 2 to be patterned. The pattern of the cured product may be formed in all the areas of the substrate 2 by one impressing operation.

Figure 9E:
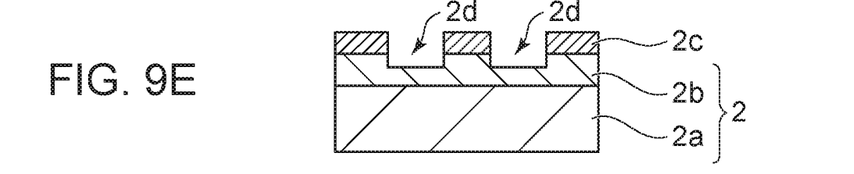
FIG. 9E is a diagram illustrating a fifth step of the method for manufacturing the article.

Next, a method for processing the substrate 2 using the cured pattern will be described. As illustrated in FIG. 9E, when etching is performed using the pattern of the cured product as an etching resistant mask, portions of the surface of the workpiece 2b where no cured product is present or thinly left are removed to form grooves 2d.

Figure 9F:
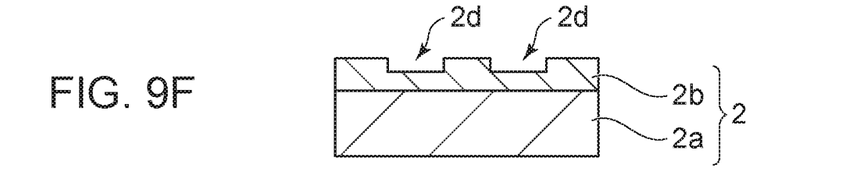
FIG. 9F is a diagram illustrating a sixth step of the method for manufacturing the article.

As illustrated in FIG. 9F, when the pattern of the cured imprint material 2c is removed, an article in which the grooves 2d are formed in the surface of the workpiece 2b can be obtained.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-126969 filed Jun. 27, 2016, which is hereby incorporated by reference herein in its entirety.

What is claimed is:

1. A discharge apparatus comprising:
   a discharger configured to discharge liquid containing a volatile compound from a discharge port;
   a detection unit having a light emitter that emits a light into a space where a volatile component volatilized from the liquid discharged from the discharge port is present, and a light receiver that receives a scattered light generated by scattering of the light from the light emitter by the volatile component; and a processor configured to perform operations including:

detecting a discharge of the liquid from the discharge port based on an amount of the scattering light received by the light receiver, and determining whether an abnormal discharge has occurred based on a control signal from an instruction unit for instructing the discharger to discharge the liquid.

2. A discharge apparatus comprising:

a discharger configured to discharge liquid containing a volatile compound from a discharge port;

a detection unit having a reflection member and an interferometer opposed to each other across a space in which the volatile component is present, the detection unit being configured to measure a distance between the reflection member and the interferometer by the interferometer detecting a light from the reflection member, and a processor configured to perform operations including:

detecting a discharge of the liquid from the discharge port using a fact that output of the interferometer changes as a refractive index of the space changes depending on the volatile component.

3. A discharge apparatus comprising:

a discharger configured to discharge liquid containing a volatile compound from a discharge port;

a detection unit having a light emitter that emits a light into a space where a volatile component volatilized from the liquid discharged from the discharge port is present, and a light receiver that receives a scattered light generated by scattering of the light from the light emitter by the volatile component;

an air conditioner configured to blow a gas into a space facing the discharge port to guide the volatile component to the detection unit; and a processor configured to perform operations including:

detecting a discharge of the liquid from the discharge port based on an amount of the scattering light received by the light receiver.

4. The discharge apparatus according to claim 1, wherein, in a case where the detection unit does not detect discharge of the liquid corresponding to the control signal, the determining determines that a normal discharge has not occurred.

5. The discharge apparatus according to claim 1, wherein, in a case where the detection unit detects discharge of the liquid that does not corresponds to the control signal, the determining determines that an abnormal discharge has occurred.

6. An imprint apparatus comprising:

the discharge apparatus configured to discharge an imprint material as the liquid, comprising:

a discharger configured to discharge liquid containing a volatile compound from a discharge port, a detection unit having a light emitter that emits a light into a space where a volatile component volatilized from the liquid discharged from the discharge port is present, and a light receiver that receives a scattered light generated by scattering of the light from the light emitter by the volatile component, and a processor configured to perform operations including:

detecting a discharge of the liquid from the discharge port based on an amount of the scattering light received by the light receiver; and a mold driving mechanism configured to drive the mold to press against the imprint material on a substrate to which the imprint material discharged from the discharge apparatus is applied so that the pattern is formed on the imprint material.

7. An imprint apparatus comprising:

the discharge apparatus according to claim 5 configured to discharge an imprint material as the liquid;

a stage that supports a substrate to which the imprint material discharged from the discharge apparatus is applied;

a driving mechanism configured to move the stage relative to the discharge apparatus according to a movement control signal;

a mold driving mechanism configured to drive the mold to press against the imprint material on a substrate to which the imprint material discharged from the discharge apparatus is applied so that the pattern is formed on the imprint material; and the processor is further configured to perform the following operations:

in a case where the determining determines that an abnormal discharge has occurred, estimating a position where the imprint material has adhered from the movement control signal and a timing at which the abnormal discharge is detected.

8. The imprint apparatus according to claim 7, the processor is further configured to perform the following operations:

notifying a user of the position where the imprint material has adhered, estimated by the position estimating unit.

9. The imprint apparatus according to claim 7, further comprising:

an emitter configured to cure the imprint material by applying energy, and wherein, in a case where estimating includes estimating that the imprint material has adhered on the substrate, the imprint material is cured by the emitter.

10. A method for manufacturing an article, the method comprising:

forming a pattern on a substrate using the discharge apparatus according to claim 1; and processing the substrate on which the pattern is formed to manufacture the article.

11. A method for detecting discharge in a discharge apparatus that discharges liquid containing a volatile compound from a discharge port, the method comprising:

emitting a light by a light emitter into a space where a volatile component volatilized from the liquid discharged from the discharge port is present;

receiving a scattered light generated by scattering of the light from the light emitter by the volatile component;

detecting a discharge of the liquid from the discharge port based on an amount of the received scattering light; and determining whether an abnormal discharge has occurred based on a control signal from an instruction unit for instructing the discharger to discharge the liquid.

12. The method of detection according to claim 11, further comprising:

measuring a distance between a reflection member and an interferometer by the interferometer detecting a light from the reflection member;

and detecting a discharge of the liquid from the discharge port by using a fact that output of the interferometer changes as a refractive index of the space changes depending on the volatile component.

13. A method for determining whether an abnormal discharge has occurred in a discharge apparatus comprising: a discharger configured to discharge liquid containing a volatile compound from a discharge port, the method comprising:

emitting a light by a light emitter into a space where a volatile component volatilizing from the liquid discharged from the discharge port is present;

receiving a scattered light generated by scattering of the light from the light emitter by the volatile component; and     detecting a discharge of the liquid from the discharge port based on an amount of the received scattering light,     wherein, in a case where the detecting does not detect the discharge of the liquid corresponding to a control signal from an instruction unit for instructing the discharger to discharge the liquid, it is determined that a normal discharge has not occurred.

14. A method for determining whether an abnormal discharge has occurred in a discharge apparatus comprising: a discharger configured to discharge liquid containing a volatile compound from a discharge port, the method comprising:

emitting a light by a light emitter into a space where a volatile component volatilizing from the liquid discharged from the discharge port is present;

receiving a scattered light generated by scattering of the light from the light emitter by the volatile component; and     detecting a discharge of the liquid from the discharge port based on an amount of the received scattering light,     wherein, in a case where the detecting detects the discharge of the liquid not corresponding to a control signal from an instruction unit for instructing the discharger to discharge the liquid, it is determined that an abnormal discharge has occurred.

15. The method of determination according to claim 14, wherein, in a case where the detecting does not detect the discharge of the liquid corresponding to the control signal, it is determined that a normal discharge has not occurred.

* * * * *